United States Patent
Hong

(10) Patent No.: US 9,575,861 B2
(45) Date of Patent: Feb. 21, 2017

(54) SYSTEM ON CHIP INCLUDING BUILT-IN SELF TEST CIRCUIT AND BUILT-IN SELF TEST METHOD THEREOF

(71) Applicant: SAMSUNG ELECTRONICS CO., LTD., Suwon-si, Gyeonggi-do (KR)

(72) Inventor: Yong-Jun Hong, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 170 days.

(21) Appl. No.: 14/476,076

(22) Filed: Sep. 3, 2014

(65) Prior Publication Data

US 2015/0074459 A1  Mar. 12, 2015

(30) Foreign Application Priority Data

Sep. 9, 2013  (KR) .................. 10-2013-0108077

(51) Int. Cl.
| | |
|---|---|
| G06F 11/27 | (2006.01) |
| G06F 11/22 | (2006.01) |
| G06F 13/362 | (2006.01) |
| G11C 29/44 | (2006.01) |
| G11C 16/00 | (2006.01) |

(Continued)

(52) U.S. Cl.
CPC ........... G06F 11/27 (2013.01); G01R 31/3187 (2013.01); G01R 31/31813 (2013.01); G01R 31/31919 (2013.01); G06F 11/2221 (2013.01); G06F 11/2236 (2013.01); G06F 13/362 (2013.01); G11C 16/00 (2013.01); G11C 16/06 (2013.01); G11C 29/10 (2013.01); G11C 29/18 (2013.01); G11C 29/44 (2013.01); G11C 2029/0401 (2013.01); G11C 2029/1208 (2013.01); G11C 2029/3602 (2013.01); G11C 2207/104 (2013.01)

(58) Field of Classification Search
CPC ... G06F 11/27; G06F 11/2221; G06F 11/2236; G06F 13/362; G11C 2029/3602; G11C 29/44; G11C 16/00; G11C 16/06; G11C 2029/0401; G11C 2029/1208; G11C 2207/104; G11C 29/10; G11C 29/18; G01R 31/31813; G01R 31/3187; G01R 31/31919
USPC ....... 714/718, 733, 738, 719, 723, 735, 736, 714/739, 742, 25, 30, 42
See application file for complete search history.

(56) References Cited

U.S. PATENT DOCUMENTS 6,343,366 B1 * 1/2002 Okitaka ................. G11C 29/44
 714/719
6,560,740 B1 * 5/2003 Zuraski, Jr. ........ G01R 31/3187
 714/727

(Continued)

FOREIGN PATENT DOCUMENTS

| JP | 11015740 | 1/1999 |
|---|---|---|
| JP | 2000222235 | 8/2000 |

(Continued)

Primary Examiner — John J Tabone, Jr.
(74) Attorney, Agent, or Firm — F. Chau & Associates, LLC

(57) ABSTRACT

A system on chip is provided which performs a built-in self-test operation using an error access pattern. The system on chip includes a master device and a slave device. A bus is configured to transfer an instruction from the master device to the slave device. A built-in instruction capture circuit is configured to receive and store the instruction. The built-in instruction capture circuit stores the instruction as the error access pattern when an error occurs in the slave device due to the instruction.

20 Claims, 13 Drawing Sheets

(51) Int. Cl.
  *G11C 16/06* (2006.01)
  *G11C 29/10* (2006.01)
  *G11C 29/18* (2006.01)
  *G01R 31/3181* (2006.01)
  *G01R 31/3187* (2006.01)
  *G01R 31/319* (2006.01)
  *G11C 29/36* (2006.01)
  *G11C 29/04* (2006.01)
  *G11C 29/12* (2006.01)

(56) References Cited

U.S. PATENT DOCUMENTS

| | | | |
|---|---|---|---|
| 6,802,034 B2 | 10/2004 | Matsuo et al. | |
| 7,490,278 B2 | 2/2009 | Tseng | |
| 7,725,793 B2* | 5/2010 | Yamada | G01R 31/31919 714/703 |
| 7,774,667 B2* | 8/2010 | Saito | G11C 29/1201 714/718 |
| 7,941,713 B2* | 5/2011 | Chang | G11C 29/16 714/718 |
| 2005/0172180 A1* | 8/2005 | Damodaran | G11C 29/16 714/723 |
| 2005/0262401 A1* | 11/2005 | Saitou | G06F 11/2236 714/42 |
| 2008/0263414 A1* | 10/2008 | Saito | G11C 29/1201 714/718 |
| 2013/0019130 A1* | 1/2013 | Hakhumyan | G11C 29/10 714/718 |
| 2013/0021861 A1 | 1/2013 | Shvydun et al. | |
| 2014/0244864 A1* | 8/2014 | Shiga | G11C 29/12015 710/5 |

FOREIGN PATENT DOCUMENTS

| | | |
|---|---|---|
| JP | 2001297598 | 10/2001 |
| JP | 2004030783 | 1/2004 |
| KR | 1020100020827 | 2/2010 |

* cited by examiner

Fig. 4

| Memory Controller | BIST | BIIC | Operation Mode |
|---|---|---|---|
| Enable | Enable | Enable | Not Allowed |
| Enable | Enable | Disable | Not Allowed |
| Enable | Disable | Enable | Operating BIIC Mode |
| Enable | Disable | Disable | Normal Operation Mode |
| Disable | Enable | Enable | Not Allowed |
| Disable | Enable | Disable | BIST Test Mode |
| Disable | Disable | Enable | Not Allowed |
| Disable | Disable | Disable | Not Allowed |

# SYSTEM ON CHIP INCLUDING BUILT-IN SELF TEST CIRCUIT AND BUILT-IN SELF TEST METHOD THEREOF

CROSS-REFERENCE TO RELATED APPLICATIONS

This non-provisional patent application claims priority under 35 U.S.C. §119 to Korean Patent Application No. 10-2013-0108077 filed Sep. 9, 2013, in the Korean Intellectual Property Office, the disclosure of which is incorporated by reference herein in its entirety.

TECHNICAL FIELD

Exemplary embodiments of the inventive concept relate to a system on chip, and more particularly, to a system on chip including a self-test circuit and a self-test method thereof.

DISCUSSION OF RELATED ART

Semiconductor memory devices with increased integration may experience various types of defects. Not all of such defects may be detected by BIST (Built-In Self Test) techniques using a limited number of known test patterns.

SUMMARY

According to an exemplary embodiment of the inventive concept, a system on chip performs a built-in self-test operation using an error access pattern. The system on chip comprises a master device and a slave device. A bus transfers an instruction from the master device to the slave device. A built-in instruction capture circuit receives and stores the instruction. The built-in instruction capture circuit stores the instruction as the error access pattern when an error occurs in the slave device due to the instruction.

In an exemplary embodiment of the inventive concept, the built-in instruction capture circuit comprises an instruction capture unit. The instruction capture unit receives the instruction. An instruction buffer stores the instruction. A built-in instruction capture controller defines the instruction as the error access pattern when an error occurs in the slave device due to the instruction.

In an exemplary embodiment of the inventive concept, the system on chip further comprises a built-in self-test circuit which generates a test pattern for testing an error of the slave device using the error access pattern.

In an exemplary embodiment of the inventive concept, the built-in self-test circuit comprises an instruction buffer which stores the instruction and the error access pattern. A test pattern generator generates the test pattern using the error access pattern. A comparator compares the test pattern with the slave device's response to the test pattern and detects an error.

In an exemplary embodiment of the inventive concept, the built-in instruction capture circuit comprises an instruction capture unit which receives the instruction and stores the received instruction in the instruction buffer. A built-in instruction capture controller defines the instruction as the error access pattern when an error occurs in the slave device due to the instruction. The built-in instruction capture controller controls the instruction buffer through the bus.

In an exemplary embodiment of the inventive concept, the instruction capture unit comprises an instruction encoder configured to encode the instruction to reduce storage capacity.

In an exemplary embodiment of the inventive concept, the built-in self-test circuit comprises an instruction decoder configured to decode the error access pattern to a format used in the test pattern generator.

In an exemplary embodiment of the inventive concept, the slave device comprises a central processing unit, a graphic processing device, a memory controller, or a peripheral device interface.

According to an exemplary embodiment of the inventive concept, a built-in self-test method of a system on chip is provided. The system on chip includes a master device and a slave device. The built-in self-test method comprises receiving an instruction transferred from the master device to the slave device. The received instruction is stored in an instruction buffer. Whether an error occurs in the slave device due to the instruction is checked. The instruction stored when an error occurs in the slave device due to the instruction is defined as an error access pattern.

In an exemplary embodiment of the inventive concept, the built-in self-test method further comprises generating a test pattern for testing the slave device using the error access pattern.

In an exemplary embodiment of the inventive concept, when the instruction is received, the instruction is encoded, reducing storage capacity.

In an exemplary embodiment of the inventive concept, in generating a test pattern, the error access pattern is decoded to a format for generating the test pattern.

In an exemplary embodiment of the inventive concept, the built-in self-test method further comprises transferring the test pattern to the slave device.

An error is detected by comparing the test pattern with the slave device's response to the test pattern.

In an exemplary embodiment of the inventive concept, the slave device comprises a central processing unit, a graphic processing device, a memory controller, or a peripheral device interface.

According to an exemplary embodiment of the inventive concept, a system on chip comprises a master device and a slave device. A bus is configured to transfer an instruction between the master device and the slave device. A capturing circuit is configured to receive the instruction. A test circuit has a storage unit. The capturing circuit is configured to store in the storage unit the captured instruction as an error access pattern when a first error is caused in the slave device by the instruction.

The test circuit is configured to generate a test pattern for testing a second error in the slave device using the error access pattern.

The instruction is encoded, and the encoded instruction is stored in the storage unit.

The test circuit is configured to compare the test pattern with a response to the test pattern.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein:

FIG. 4 is a diagram showing an operation mode of a system on chip shown in FIG. 3, according to an exemplary embodiment of the inventive concept;

DETAILED DESCRIPTION OF EMBODIMENTS

Figure 1:
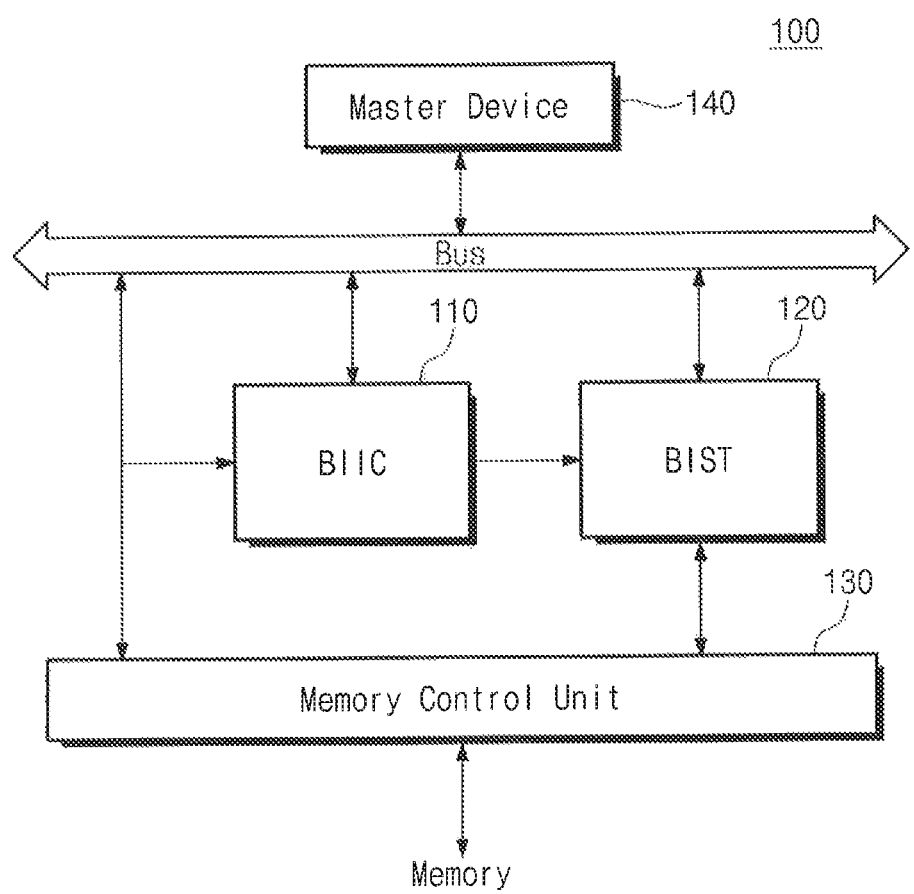
FIG. 1 is a block diagram illustrating a system on chip including a built-in self-test circuit according to an exemplary embodiment of the inventive concept.

Embodiments will be described in detail with reference to the accompanying drawings. The inventive concept, however, may be embodied in various different forms, and should not be construed as being limited only to the illustrated embodiments. Like reference numerals may denote like or similar elements throughout the drawings and the specification.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a system on chip including a built-in self-test circuit according to an exemplary embodiment of the inventive concept. Referring to FIG. 1, a system on chip 100 comprises a built-in instruction capture circuit (hereinafter, also referred to as BIIC circuit) 110 and a built-in self-test circuit (hereinafter, also referred to as BIST circuit) 120.

The BIIC circuit 110 receives an instruction between a master device 140 and a memory control unit 130. The master device 140 generates an instruction to be transferred to the memory control unit 130 via a bus. When an error occurs in a memory due to the received instruction, the BIIC circuit 110 stores the received instruction as an error access pattern. The stored error access pattern may be used to generate a test pattern in the BIST circuit 120.

The BIST circuit 120 stores a known instruction set for a built-in self test (BIST). The BIST 120 generates a test pattern using the instruction set. The BIST 120 tests an error of a memory using the test pattern. As shown in FIG. 1, a memory is tested, but a test target is not limited to a memory.

The memory control unit 130 receives an instruction from the master device 140 via the bus and controls the memory. The memory control unit 130 is connected to the BIST circuit 130 and sends a test pattern signal to the memory. The memory control unit 130 provides the BIST circuit 120 with a signal responsive to the test pattern signal.

The master device 140 generates an instruction to be transferred to a slave device. As shown in FIG. 1, the slave device may be the memory control unit 130. The master device 140 may be a central processing unit (CPU), a graphic processing unit (GPU), a memory controller, a peripheral device interface or the like. The master device 140 generates an instruction to be provided to the slave device. The slave device may process an instruction received via the bus.

The bus transfers signals to functional blocks (e.g., semiconductor intellectual properties (IPs) in the system on chip 100. For example, the bus may be an ASB (ARM System Bus), an APB (ARM Peripheral Bus), an AHB (ARM High Performance Bus), an AXI (Advanced eXtensible Interface), etc.

The memory may include an external memory or an internal memory. For example, the memory may include an EEPROM (Electrically Erasable Programmable Read-Only Memory), a flash memory, an MRAM (Magnetic RAM), an STT-MRAM (Spin-Transfer Torque MRAM), a CBRAM (Conductive bridging RAM), an FeRAM (Ferroelectric RAM), a PRAM (Phase change RAM) also called an OUM (Ovonic Unified Memory), a RRAM or ReRAM (Resistive RAM), a nanotube RRAM, a PoRAM (Polymer RAM), an NFGM (Nano Floating Gate Memory), a holographic memory, a molecular electronics memory device), or an insulator resistance change memory.

Figure 2:
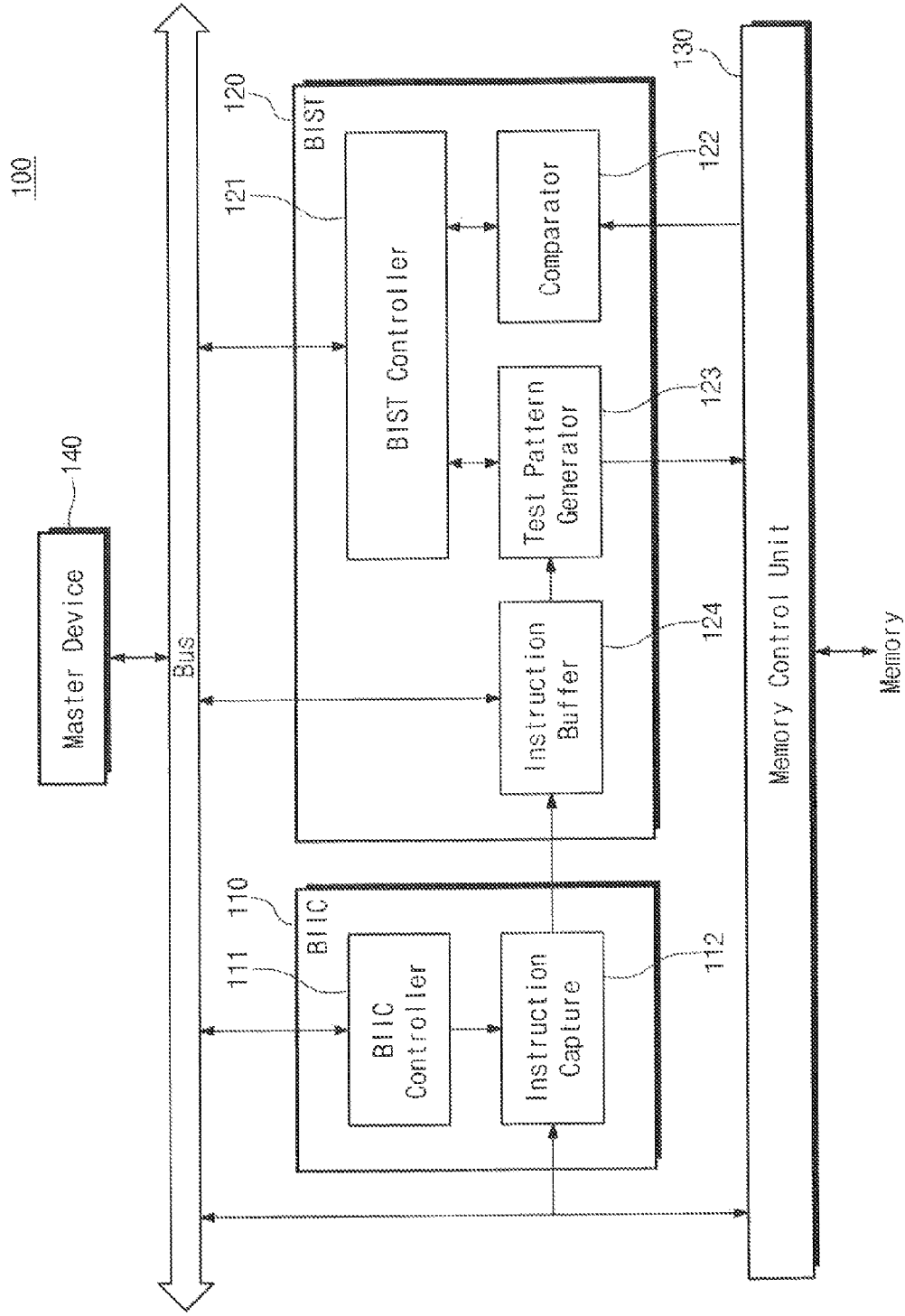
FIG. 2 is a block diagram illustrating a system on chip shown in FIG. 1, according to an exemplary embodiment of the inventive concept.

FIG. 2 is a block diagram illustrating a system on chip shown in FIG. 1, according to an exemplary embodiment of the inventive concept. Referring to FIG. 2, a system on chip 100 comprises a BIIC circuit 110 and a BIST circuit 120. The BIST circuit 120 shown in FIG. 2 comprises an instruction buffer 124. The BIIC circuit 110 uses the instruction buffer 124 of the BIST circuit 120 without a separate buffer.

The BIIC circuit 110 comprises a BIIC controller 111 and an instruction capture unit 112. The BIIC controller 111 receives an operation signal via a bus. The BIIC controller 111 controls an overall operation of the BIIC circuit 110 according to the operation signal. The BIIC circuit 111 controls the instruction capture unit 112.

The instruction capture unit 112 receives an instruction between a master device 140 and a memory control unit 130. The input instruction is stored in the instruction buffer 124. As shown in FIG. 2, the instruction buffer 124 of the BIST circuit 120 is utilized. When an error occurs in a memory due to the input instruction, the instruction capture unit 112 interrupts an input of a next instruction. The input instruction is defined as an error access pattern and is stored in the instruction buffer 124.

The BIST circuit 120 further comprises a BIST controller 121 a comparator 122, and a test pattern generator 123. The BIST controller 121 receives an operation signal via a bus. The BIST controller 121 controls an overall operation of the BIST circuit 120 according to the operation signal. The BIST controller 121 controls the test pattern generator 123 and the comparator 122.

The instruction buffer 124 stores an instruction set for BIST. The instruction set may be used to perform a basic BIST. The instruction buffer 124 temporarily stores an instruction received by the BIIC circuit 110. When an error occurs in a memory, the temporarily stored instruction is stored as an error access pattern.

The test pattern generator 123 generates a test pattern used to test the memory according to an instruction of the BIST controller 121. The test pattern generator 123 generates the test pattern using the error access pattern and the instruction set and that are stored in the instruction buffer 124.

The comparator 122 receives data generated by the test pattern generator 123 through the BIST controller 121. The comparator 122 reads data that is sent from the test pattern generator 123 to the memory. The comparator 122 compares data received from the BIST controller 121 with data received from the memory. That two data values are different from each other means that an error occurs. The comparator 122 provides the BIST controller 121 with a comparison result indicating whether an error occurs.

The memory control unit 130 controls the memory in response to an instruction received through the bus in a normal operation. The memory control unit 130 is connected to the BIST circuit 130 during a BIST operation and transfers a test pattern to the memory.

The master device 140 generates an instruction to be provided to a slave device. The slave device processes an instruction received via the bus. As shown in FIG. 2, the slave device may be the memory control unit 130.

In the system on chip 100 according to an exemplary embodiment of the inventive concept, the BIIC circuit 110 may acquire an individual error pattern of a chip in a fabrication process in addition to a known error pattern. The acquired error pattern is used to perform a BIST operation. Thus, the system on chip 100 according to an exemplary embodiment of the inventive concept detects various errors. A time and costs for testing a chip may be reduced by applying the error patterns to test other chips.

Figure 3:
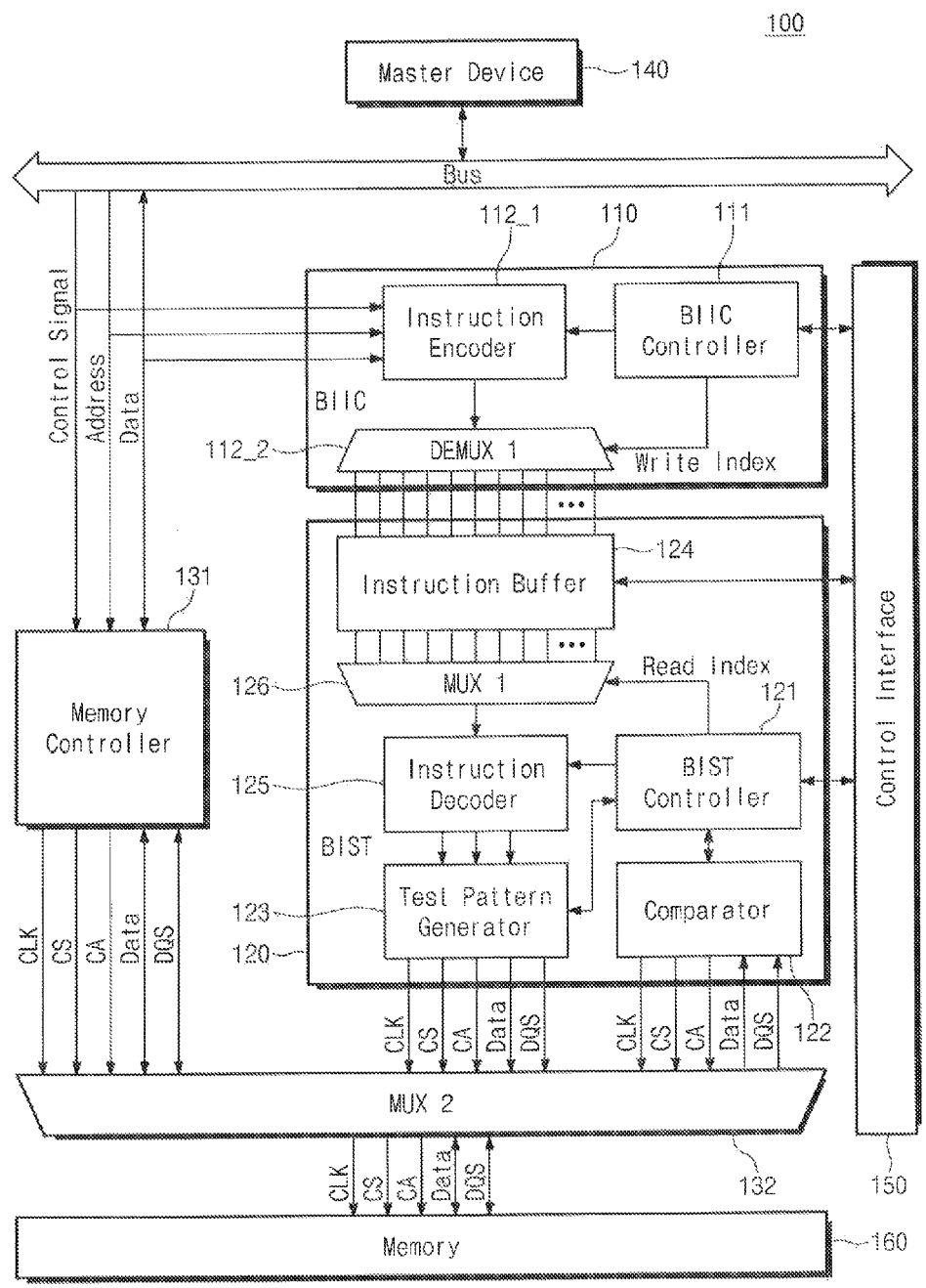
FIG. 3 is a detailed block diagram of a system on chip shown in FIG. 2, according to an exemplary embodiment of the inventive concept.

FIG. 3 is a block diagram of a system on chip shown in FIG. 2, according to an exemplary embodiment of the inventive concept. Referring to FIG. 3, during a normal operation, a master device 140 generates a control signal, an address, and data. A memory controller 131 receives the control signal, the address, and data from the master device 140 via a bus. The memory controller 131 sends control signals CLK, CS and CA for accessing a memory 160. The memory controller 131 transmits and receives data in synchronization with a signal DQS.

A BIIC circuit 110 receives an instruction transferred to the memory controller 131 through the bus during a BIIC mode of operation. The instruction may include a control signal, an address, and data. The received instruction is encoded by an instruction encoder 112_1. The instruction encoder 112_1 encodes the instruction to have a format used in the BIST circuit 120. A storage capacity is reduced by encoding and storing the instruction. Thus, the size of an instruction buffer 124 consuming a relatively large area may be reduced.

The encoded instruction is stored in the instruction buffer 124 through a first DEMUX 112_2. A BIIC controller 111 controls the instruction encoder 112_1 and the first DEMUX 112_2. The first DEMUX 112_2 stores the encoded instruction in an assigned location of the instruction buffer 124 according to a write index signal.

In an exemplary embodiment of the inventive concept, the instruction may be stored in the instruction buffer 124 without being encoded. In this case, the BIIC circuit 110 does not include the instruction encoder 112_1.

When an error occurs due to an input instruction, the BIIC controller 111 receives information indicating that an error occurs, through a control interface 150. When receiving the information indicating that an error occurs, an input of a new instruction is interrupted. The BIIC controller 111 defines an instruction causing an error as an error access pattern and stores the instruction in the instruction buffer 124 through the control interface 150.

In a BIST mode, the BIST circuit 120 generates a test pattern to test a memory 160. An operation of the memory controller 131 is interrupted during the BIST mode. The BIST controller 121 controls the instruction buffer 124 through the control interface 150. The BIST controller 121 sends a read index signal to a first MUX 126. The first MUX 126 provides an instruction decoder 125 with an instruction set or an error access pattern according to the read index signal. The instruction decoder 125 decodes the instruction set or the error access pattern to a format used in a test pattern generator 123.

In an exemplary embodiment of the inventive concept, when the instruction set or the error access pattern is stored in a format used in a test pattern generator 123, the BIST circuit 120 does not include the instruction decoder 125.

The test pattern generator 123 generates a test pattern using the received instruction set or error access pattern. A format of a test pattern signal (CLK, CS, CA, Data, and DQS) is substantially the same as a format of an output signal of the memory controller 131.

A comparator 122 receives data generated by the test pattern generator 123 through the BIST controller 121. The comparator 122 reads data, transferred to the memory 160 by the test pattern generator 123, from the memory 160. The comparator 122 compares data received from the BIST controller 121 with data received from the memory 160. That two data values are different from each other means that an error occurs. The comparator 122 provides the BIST controller 121 with a comparison result indicating whether an error occurs.

The BIIC controller 111, the BIST controller 121 and the instruction buffer 124 exchanges information via the control interface 150. The control interface 150 may include a bus. A second MUX 132 sends one of a signal of the memory controller 131 and a signal of the BIST circuit 120 to the memory 160 according to an operation mode.

FIG. 4 is a diagram showing an operation mode of a system on chip shown in FIG. 3, according to an exemplary embodiment of the inventive concept. Referring to FIGS. 3 and 4, each of a memory controller 131, a BIIC circuit 110, and a BIST circuit 120 may be in an enable state or a disable state. In a normal operation mode, the memory controller 131 is in the enable state. In the normal operation mode, normal read and write operations of a memory 160 are performed.

In a BIST mode, the BIST circuit 120 is in the enable state. In the BIST mode, the BIST circuit 120 generates a test pattern to test an error of the memory 160.

In a BIIC operation mode, the GIST circuit is in the disable state. For example, the memory controller 131 and the BIIC circuit 110 are in the enable state. In the BIIC operation mode, the BIIC circuit 110 receives an instruction between a bus and the memory controller 131, acquiring an error access pattern. The error access pattern acquired is used to generate a test pattern in the BIST mode. Other cases than the three modes are not allowed.

Figure 5:
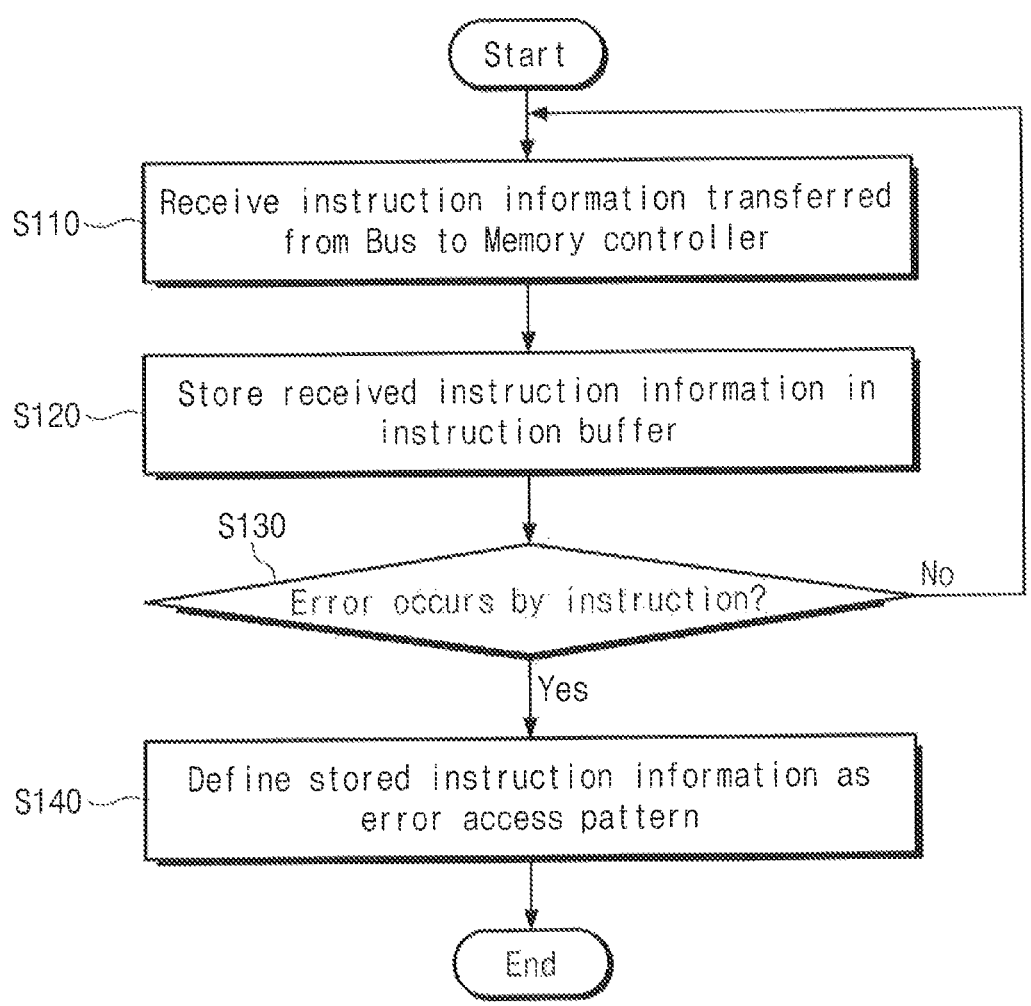
FIG. 5 is a flow chart illustrating a built-in instruction capture (BIIC) method according to an exemplary embodiment of the inventive concept.

FIG. 5 is a flow chart illustrating a built-in instruction capture (BIIC) method according to an exemplary embodiment of the inventive concept. Referring to FIGS. 3 to 5, a BIIC circuit 110 acquires an error access pattern through a BIIC method. FIG. 5 shows a method of acquiring an input instruction without encoding.

In step S110, the BIC circuit 110 receives instruction information transferred from a master device 140 to a memory controller 131 through a bus. A BIIC operation mode is set. Thus, the memory controller 131 and the BIIC circuit 110 are in an enable state.

In step S120, the BIIC circuit 110 stores the received instruction information in an instruction buffer 124. A BIIC controller 111 transfers a write index to a first DEMUX 112_2. The first DEMUX 112_2 stores the received instruction information in an assigned location of the instruction buffer 124 according to the write index.

In step S130, the BIIC circuit 110 checks whether an error occurs in a memory 160 due to the received instruction. When no error occurs, the method proceeds to step S110, receiving next instruction information. When an error occurs, the method proceeds to step S140. When an error occurs, the BIIC controller 111 receives information indicating that an error occurs, from a central processing unit (not shown) through a control interface 150.

In step S140, when an error occurs in the memory 160 due to the received instruction, the BIIC controller 111 defines instruction information stored in the instruction buffer 124 through the control interface 150 as an error access pattern. The error access pattern is used to generate a test pattern in a BIST operation.

With the above-described BIIC method, the BIIC circuit 110 may acquire an individual error pattern of a chip due to a fabrication process in addition to a known error pattern. The acquired error pattern is used to perform a BIST operation. Thus, a system on chip 100 according to an exemplary embodiment of the inventive concept detects various errors. Time and costs for testing of a chip are reduced by applying the acquired error patterns to test other chips.

Figure 6:
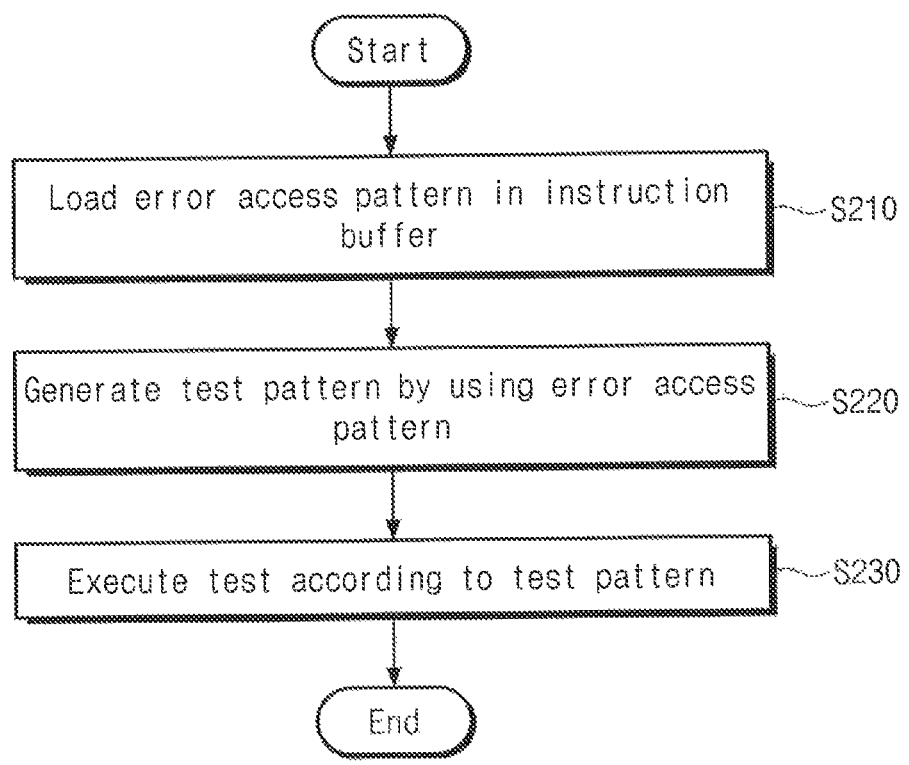
FIG. 6 is a flow chart illustrating a built-in self-test (BIST) method according to an exemplary embodiment of the inventive concept.

FIG. 6 is a flow chart illustrating a built-in self-test (BIST) method according to an exemplary embodiment of the inventive concept. Referring to FIGS. 3 to 6, a BIST circuit 120 performs a BIST operation using an error access pattern acquired through a BIIC method described with reference to FIG. 5. FIG. 6 shows a method of performing a BIST operation without decoding an error access pattern. A BIST mode is set as an operation mode. Thus, a BIST circuit 120 is in an enable state.

In step S210, the BIST circuit 120 loads an error access pattern stored in an instruction buffer 124. The BIST controller 121 sends a read index signal to a first MUX 126, The first MUX 126 transfers the error access pattern to a test pattern generator 123 according to the read index signal.

In step S220, the test pattern generator 123 generates a test pattern using the error access pattern. The test pattern includes test pattern signals (CLK, CS, CA, Data, and DQS). The test pattern signals are sent to a memory 160 through a second MUX 132. Data to be transferred to the memory 160 is also provided from the test pattern generator 123 to a BIST controller 121.

In step S230, the BIST circuit 120 performs a BIST operation according to the test pattern generated by the test pattern generator 123, A comparator 122 reads data transferred from the test pattern generator 123 from the memory 160. The comparator 122 compares data received from the memory 160 with original data transferred from the BIST controller 121. That two data values are different from each other means that an error occurs. The comparator 122 provides the BIST controller 121 with a comparison result indicating whether an error occurs.

Figure 7:
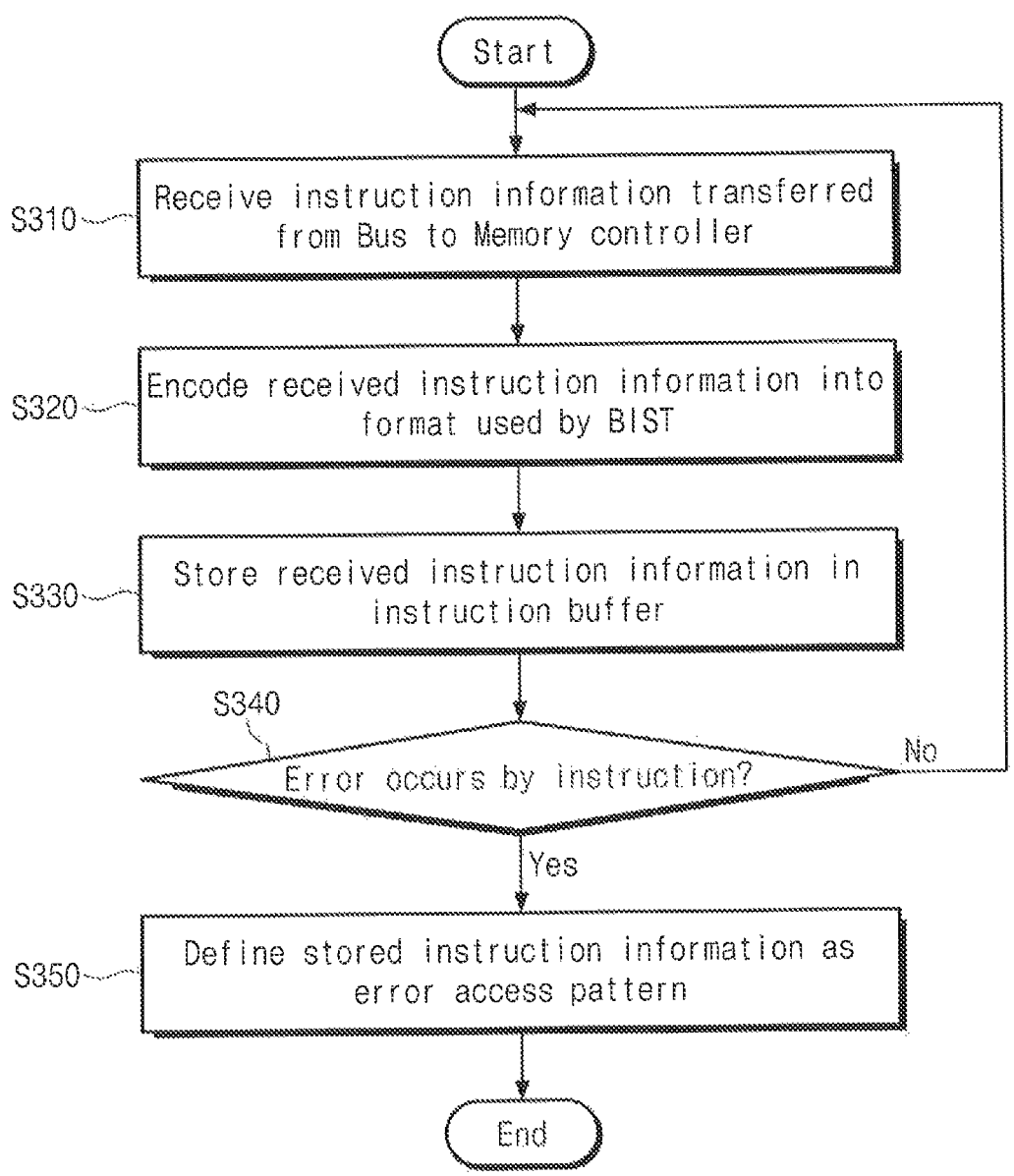
FIG. 7 is a flow chart illustrating a built-in instruction capture (BIIC) method according to an exemplary embodiment of the inventive concept.

FIG. 7 is a flow chart illustrating a built-in instruction capture (BIIC) method according to an exemplary embodiment of the inventive concept. Referring to FIGS. 3, 4, and 7, a BIIC circuit 110 acquires an error access pattern using a BIIC method. FIG. 7 shows a method of efficiently using a storage space by encoding an input instruction.

In step S310, the BIIC circuit 110 receives instruction information transferred from a master device 140 to a memory controller 131 through a bus. A BIIC operation mode is set. The memory controller 131 and the BIIC circuit 110 are in an enable state.

In step S320, an instruction encoder 112_1 encodes the instruction information to have a format used in a BIST circuit 120. The input instruction information is encoded to have the same format as an instruction set previously stored in an instruction buffer 124.

In step S330, the BIIC circuit 110 stores the encoded instruction information in the instruction buffer 124. A BIIC controller 111 transfers a write index signal to a first DEMUX 112_2. The first DEMUX 112_2 stores the encoded instruction information in an assigned location of the instruction buffer 124 according to the write index signal.

In step S340, the BIIC circuit 110 checks whether an error occurs in a memory 160 due to the received instruction. When no error occurs, the method proceeds to step S310, receiving next instruction information. When an error occurs, the method proceeds to step S350. When an error occurs, the BIIC controller 111 receives information indicating that an error occurs, from a central processing unit (not shown) through a control interface 150.

In step S350, when an error occurs in the memory 160 due to the received instruction, the BIIC controller 111 defines instruction information stored in the instruction buffer 124 through the control interface 150 as an error access pattern. The error access pattern is used to generate a test pattern in a BIST operation.

Figure 8:
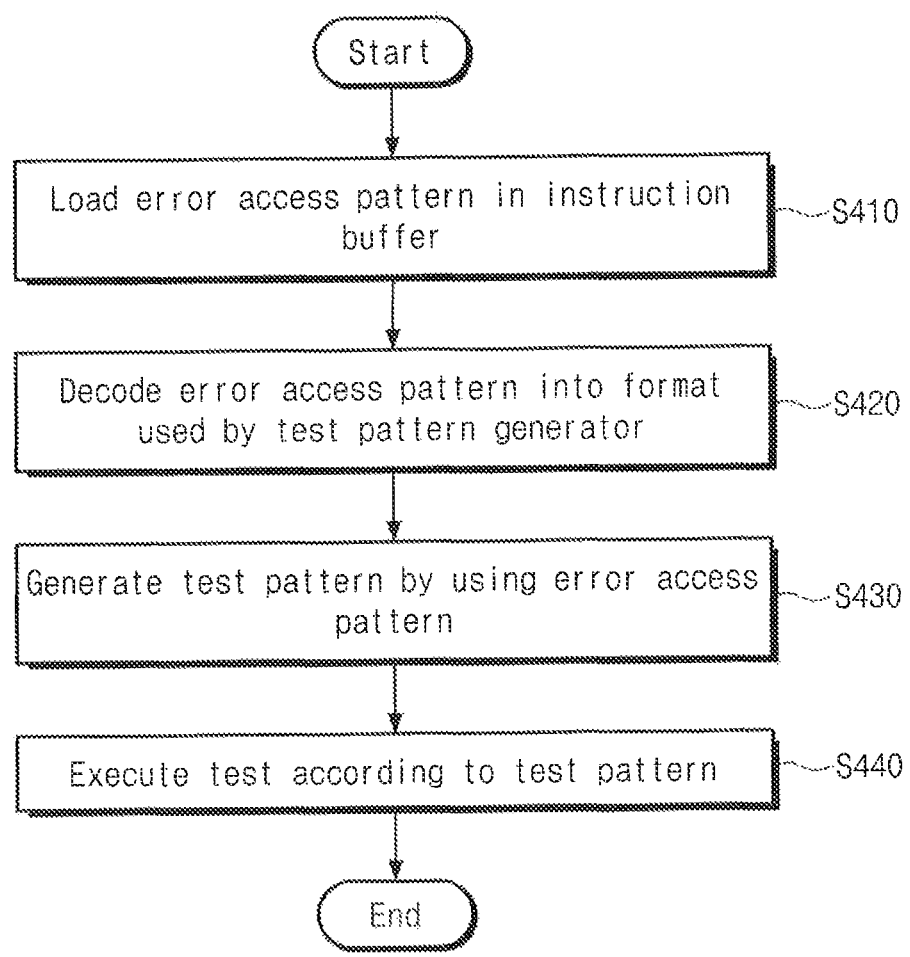
FIG. 8 is a flow chart illustrating a built-in self-test (BIST) method according to an exemplary embodiment of the inventive concept.

FIG. 8 is a flow chart illustrating a built-in self-test (BIST) method according to an exemplary embodiment of the inventive concept. Referring to FIGS. 3, 4, and 8, a BIST circuit 120 performs a BIST operation using an error access pattern acquired through a BIIC method described with reference to FIG. 7. As shown in FIG. 8, a BIST operation is performed after decoding an error access pattern encoded in FIG. 7. A BIST mode is set as an operation mode. Thus, a BIST circuit 120 is in an enable state.

In step S410, the BIST circuit 120 loads an error access pattern stored in an instruction buffer 124. The BIST controller 121 sends a read index signal to a first MUX 126, The first MUX 126 transfers the error access pattern to an instruction decoder 125 according to the read index signal.

In step S420, the instruction decoder 125 decodes the error access pattern to a format used in a test pattern generator 123. The decoded error access pattern is sent to the test pattern generator 123.

In step S430, the test pattern generator 123 generates a test pattern using the error access pattern. The test pattern includes test pattern signals (CLK, CS, CA, Data, and DQS). The test pattern signals are sent to a memory 160 through a second MUX 132. Data to be transferred to the memory 160 is also provided from the test pattern generator 123 to a BIST controller 121.

In step S440, the BIST circuit 120 performs a BIST operation according to the test pattern generated by the test pattern generator 123. A comparator 122 reads data transferred from the test pattern generator 123 from the memory 160. The comparator 122 compares data received from the memory 160 with original data transferred from the BIST controller 121. That two data values are different from each other means that an error occurs. The comparator 122 provides the BIST controller 121 with a comparison result indicating whether an error occurs.

By the BIIC methods described with reference to FIGS. 7 and 8, an input instruction is encoded and stored. The encoded instruction is used after decoding. Thus, a storage capacity is reduced. Accordingly, the size of an instruction buffer consuming a relatively large area may be reduced.

Figure 9:
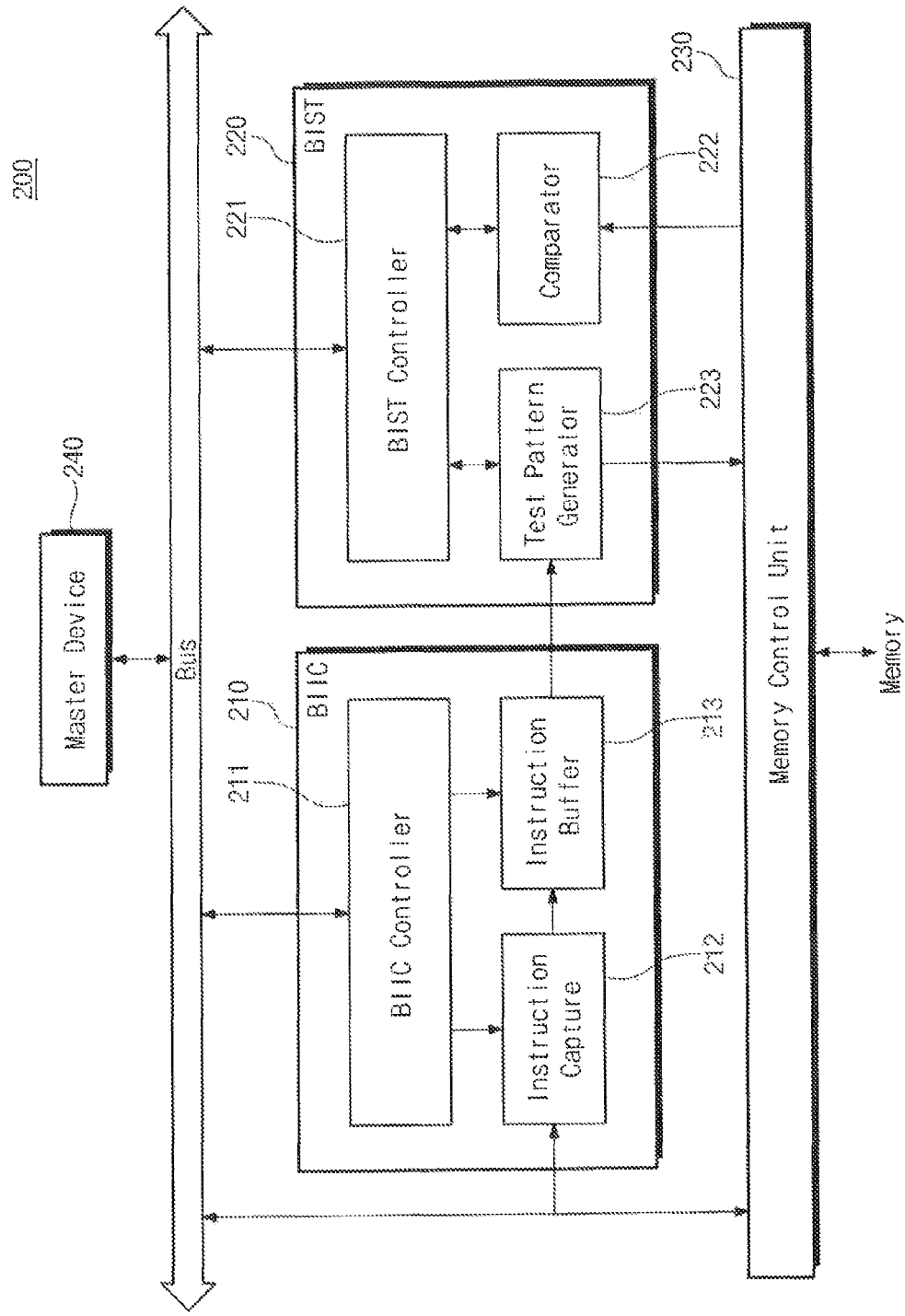
FIG. 9 is a block diagram illustrating a system on chip including a built-in instruction capture (BIIC) circuit according to an exemplary embodiment of the inventive concept.

FIG. 9 is a block diagram illustrating a system on chip including a built-in instruction capture (BIIC) circuit according to an exemplary embodiment of the inventive concept. Referring to FIG. 9, a BIST circuit does not include a buffer memory. Thus, a BIIC circuit 210 comprises an instruction buffer 213. An overall operation of a system on chip 200 shown in FIG. 9 is substantially the same as an overall operation of a system on chip 100 shown in FIG. 2.

The BIIC circuit 210 further comprises a BIIC controller 211 and an instruction capture unit 212. The BIIC controller 211 receives an operation signal via a bus. The BIIC controller 211 controls an overall operation of the BIIC circuit 110 according to the operation signal. The BIIC circuit 211 controls the instruction capture unit 212 and the instruction buffer 213.

The instruction capture unit 212 receives an instruction between a master device 240 and a memory control unit 230. The input instruction is stored in the instruction buffer 213. When an error occurs in a memory due to the input instruction, the instruction capture unit 212 interrupts an input of a next instruction. The input instruction is defined as an error access pattern and is stored in the instruction buffer 213.

The instruction buffer 213 temporarily stores an instruction received by the instruction capture unit 212. When an error occurs in the memory due to the input instruction, the temporarily stored instruction is defined as an error access pattern and is stored. The instruction buffer 213 is included in the BIIC circuit 210 and is used for acquiring an error access pattern.

The BIST circuit 220 comprises a BIST controller 221, a comparator 222, and a test pattern generator 223. The BIST controller 221 receives an operation signal via a bus. The BIST controller 221 controls an overall operation of the BIST circuit 220 according to the operation signal. The BIST controller 221 controls the test pattern generator 223 and the comparator 222.

The test pattern generator 223 generates a test pattern used to test the memory according to an instruction of the BIST controller 221. The test pattern generator 223 generates the test pattern using the error access pattern stored in the instruction buffer 213.

The comparator 222 compares data provided to the memory by the test pattern generator 223 and data received from the memory. The comparator 222 provides the BIST controller 221 with a comparison result indicating whether an error occurs, The memory control unit 230 controls the memory in response to an instruction received through the bus in a normal operation. The memory control unit 230 is connected to the BIST circuit 230 during a BIST operation and transfers a test pattern to the memory. The memory control unit 230 transfers data from the memory to the comparator 222.

A master device 240 generates an instruction to be provided to a slave device. The slave device processes an instruction received via the bus. As shown in FIG. 9, the slave device may be the memory control unit 230.

Figure 10:
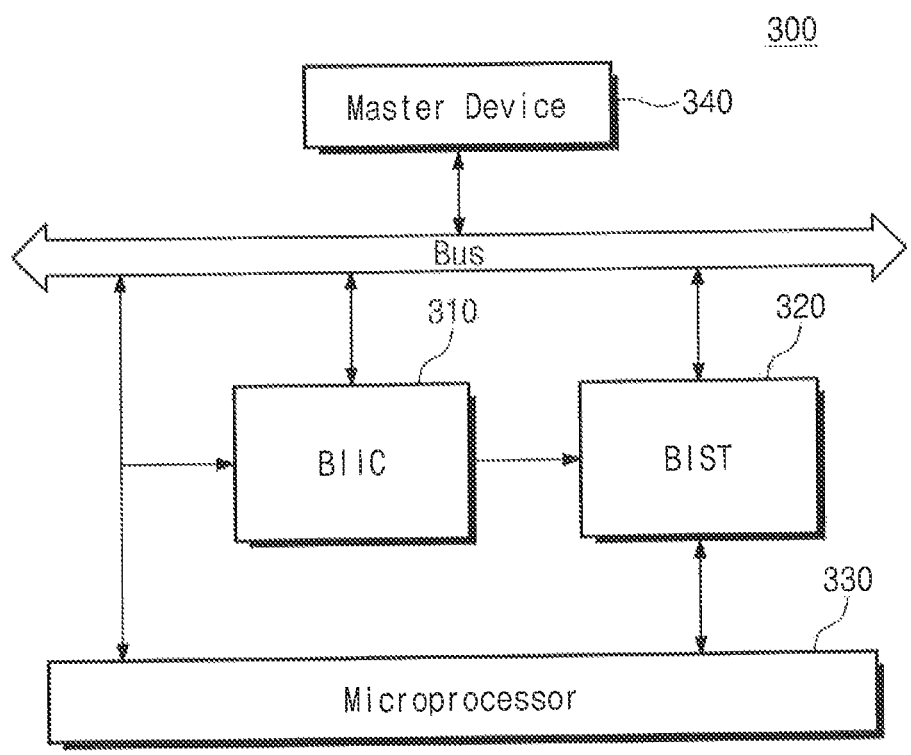
FIG. 10 is a block diagram illustrating a system on chip including a built-in instruction capture (BIIC) circuit according to an exemplary embodiment of the inventive concept.

FIG. 10 is a block diagram illustrating a system on chip including a built-in instruction capture (BIIC) circuit according to an exemplary embodiment of the inventive concept. Referring to FIG. 10, a BIIC circuit 310 receives an instruction between a master device 340 and a microprocessor 330.

The master device 340 generates an instruction to be transferred to the microprocessor 330. The microprocessor 330 may be a central processing unit (CPU) or a graphic processing unit (GPU). When an error occurs in the microprocessor 330 due to the received instruction, the BIIC circuit 310 stores the received instruction as an error access pattern.

The BIST circuit 320 generates a test pattern using an error access pattern stored in the BIIC circuit 310. The BIST circuit 320 sends the test pattern signal to the microprocessor 330. The BIST circuit 320 compares the transferred test pattern signal and a response signal from the microprocessor 330 to check whether an error occurs.

Figure 11:
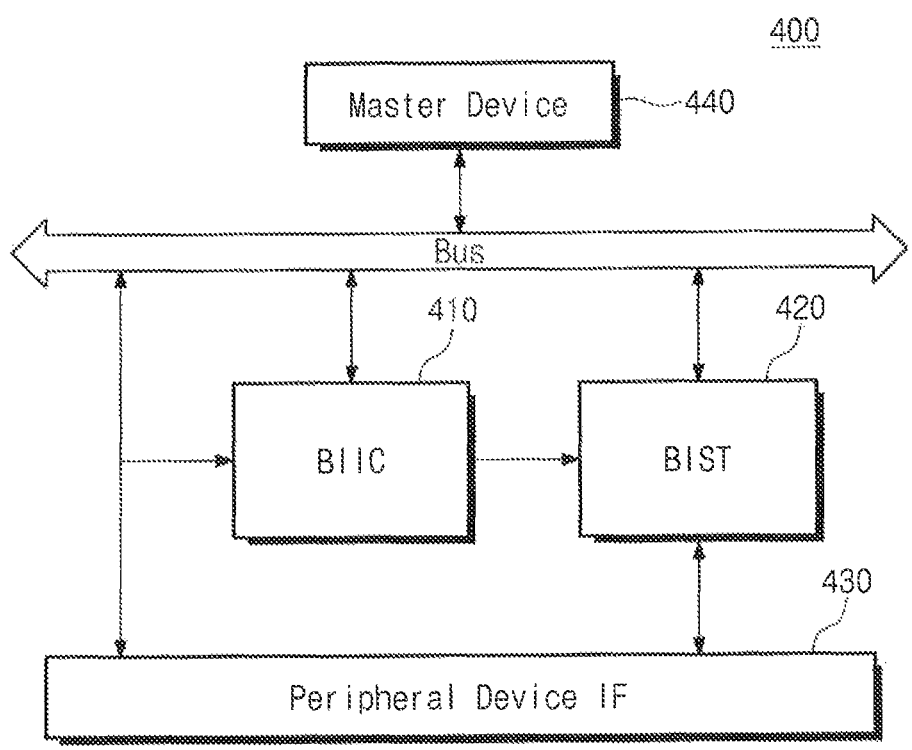
FIG. 11 is a block diagram illustrating a system on chip including a built-in instruction capture (BIIC) circuit according to an exemplary embodiment of the inventive concept.

FIG. 11 is a block diagram illustrating a system on chip including a built-in instruction capture (BIIC) circuit according to an exemplary embodiment of the inventive concept. Referring to FIG. 11, a BIIC circuit 410 receives an instruction between a master device 440 and a peripheral device interface 430.

The peripheral device interface 430 may be a device (e.g., a camera interface, a video codec, a graphic engine, etc.) that performs a particular function in a system on chip 400. When an error occurs in the peripheral device interface 430 due to the received instruction, the BIIC circuit 410 stores the received instruction as an error access pattern.

The BIST circuit 420 generates a test pattern using an error access pattern stored in the BIIC circuit 410. The BIST circuit 420 sends the test pattern signal to the peripheral device interface 430. The BIST circuit 420 compares the transferred test pattern signal with a response signal from the peripheral device interface 430 and checks whether an error occurs.

Figure 12:
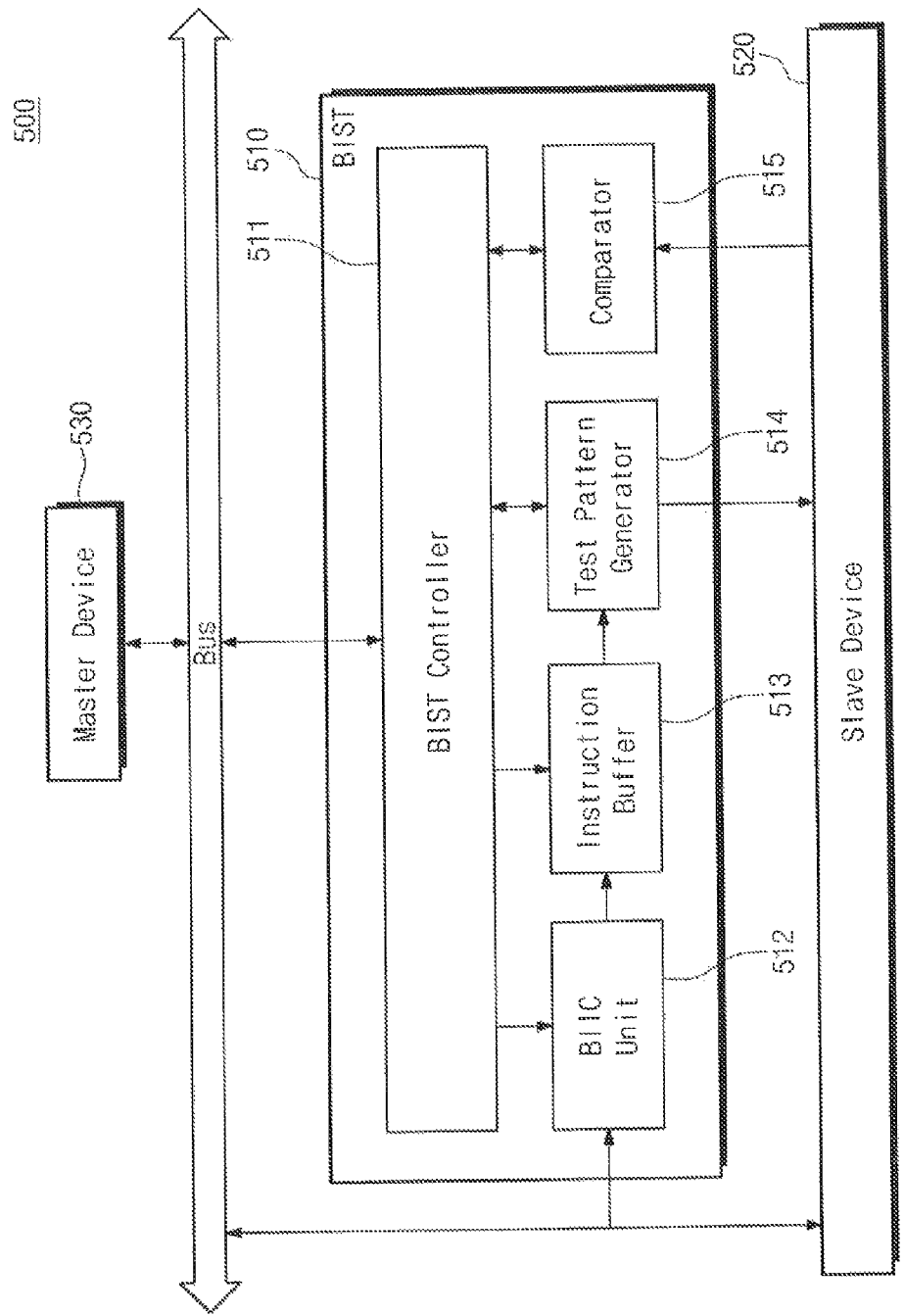
FIG. 12 is a block diagram illustrating a system on chip including a built-in instruction capture (BIIC) circuit according to an exemplary embodiment of the inventive concept.

FIG. 12 is a block diagram illustrating a system on chip including a built-in instruction capture (BIIC) circuit according to an exemplary embodiment of the inventive concept. Referring to FIG. 12, a BIIC unit 512 is implemented as a part of a BIST circuit 510. The BIST circuit 510 comprises a BIST controller 511, a BIIC unit 512, an instruction buffer 513, a test pattern generator 514, and a comparator 515.

The BIST controller 511 receives an operation signal via a bus. The BIST controller 511 controls an overall operation of the BIST circuit 510 according to the input operation signal. The BIST controller 511 controls a BIIC unit 512, an instruction buffer 513, a test pattern generator 514, and a comparator 515.

The BIIC unit 512 receives an instruction between a master device 530 and a slave device 520. The BIIC unit 512 stores the input instruction in the instruction buffer 513. The BIIC unit 512 may encode the input instruction, reducing capacity. When an error occurs in the slave device 520 due to the input instruction, the BIST controller 511 stores the input instruction in the instruction buffer 513 as an error access pattern.

The instruction buffer 513 stores a known instruction set. The instruction buffer 513 temporarily stores an instruction received by the BIIC unit 512. When an error occurs in the slave device 520 due to the received instruction, the BIIC circuit 513 stores the received instruction as an error access pattern.

The test pattern generator 514 generates a test pattern used to test the slave device 520 in response to an instruction of the BIST controller 510. The test pattern generator 514 generates a test pattern using an instruction set and an error access pattern that are stored in the instruction buffer 513.

The comparator 515 compares a signal transferred to the slave device 510 by the test pattern generator 514 with a signal received from the slave device 520 in response to the signal. The comparator 515 provides the BIST controller 511 with a comparison result indicating whether an error occurs.

The slave device 520 may include all of the functional blocks (e.g., semiconductor intellectual properties (IPs)) included in the system on chip 500. The slave device 520 may be a central processing unit (CPU), a graphic processing unit (GPU), a memory controller, a peripheral device interface or the like. However, exemplary embodiments of the inventive concept are not limited thereto.

The master device 530 generates an instruction to be transferred to the slave device 520. The generated instruction is transferred to the slave device 520 through the bus.

The master device 530 may include all intellectual properties included in the system on chip 500. The master device 530 may be a central processing unit (CPU), a graphic processing unit (GPU), a memory controller, a peripheral device interface or the like. However, exemplary embodiments of the inventive concept are not limited thereto.

Figure 13:
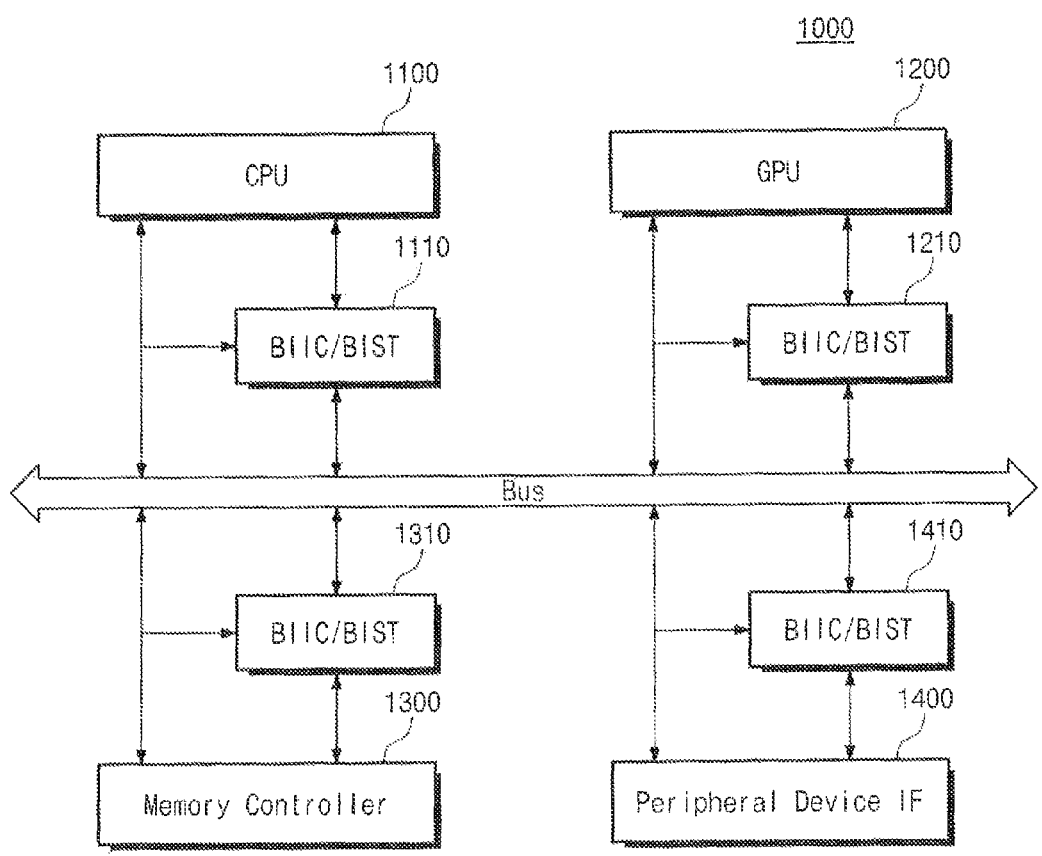
FIG. 13 is a block diagram illustrating a computing system including a BIIC/BIST circuit according to an exemplary embodiment of the inventive concept.

FIG. 13 is a block diagram illustrating a computing system including a BIIC/BIST circuit according to an exemplary embodiment of the inventive concept. Referring to FIG. 13, a computing system 1000 comprises a central processing unit 1100, a graphic processing device 1200, a memory controller 1300, a peripheral device interface 1400, and BIIC/BIST circuits 1110, 1210, 1310, and 1410 respectively connected to the components 1100, 1200, 1300, and 1400.

A master device generates an instruction to be provided to a slave device. The master device may include at least one of the central processing unit 1100, the graphic processing device 1200, the memory controller 1300, and the peripheral device interface 1400, The slave device receives an instruction generated by the master device through a bus. The slave device may include at least one of the central processing unit 1100, the graphic processing device 1200, the memory controller 1300, and the peripheral device interface 1400.

The central processing unit 1100 performs predetermined calculations or tasks. The central processing unit 1100 communicates with the memory controller 1300 and the peripheral device interface 1400 through an address bus, a control bus, and a data bus. For example, the central processing unit 1100 may be connected to an expansion bus such as a PCI (Peripheral Component Interconnect) bus.

The graphic processing device 1200 supports a graphic processing operation of the central processing unit 1100. The graphic processing device 1200 processes 2D or 3D graphic data. For example, the graphic processing device 1200 processes operations such as image information processing, acceleration, signal change, screen output, and the like.

The memory controller 1300 controls a memory device (not shown). The memory device stores data needed for an operation of the computing system 1000. For example, the memory device includes a DRAM, a mobile DRAM, an SRAM, or a nonvolatile memory device.

The peripheral device interface 1400 connects the computing system 1000 with peripheral devices. For example, the computing system 1000 may be connected to peripheral devices, such as an input device, an output device, an auxiliary storage device, and the like.

Each of the BIIC/BIST circuits 1110, 1210, 1310, and 1410 receives an instruction between a master device and a slave device. When an error occurs in a slave device due to an input instruction, each of the BIIC/BIST circuits 1110, 1210, 1310, and 1410 stores the input instruction as an error access pattern. Each of the BIIC/BIST circuits 1110, 1210, 1310, and 1410 generates a test pattern for testing a slave device using the error access pattern.

A memory chip and/or a system on chip may be packed in various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A system on chip, comprising:
    a master device;
    a slave device configured to process an instruction;
    a bus configured to transfer the instruction from the master device to the slave device for processing; and
    a built-in instruction capture circuit configured to receive and store the instruction and determine whether an error occurs due to the slave device processing the instruction,
    wherein if the error occurs, the built-in instruction capture circuit stores the instruction and defines the instruction as an error access pattern, and
    the system on chip is configured to perform a built-in self-test operation using the error access pattern.

2. The system on chip of claim 1, wherein the built-in instruction capture circuit comprises:
    an instruction capture unit configured to receive the instruction:
    an instruction buffer configured to store the instruction; and
    a built-in instruction capture controller configured to define the instruction as the error access pattern when an error occurs.

3. The system on chip of claim 1, further comprising:
    a built-in self-test circuit configured to generate a test pattern using the error access pattern,
    wherein the test pattern is used to test for errors in the slave device.

4. The system on chip of claim 3, wherein the built-in self-test circuit comprises:
    an instruction buffer configured to store the instruction and the error access pattern;
    a test pattern generator configured to generate the test pattern using the error access pattern; and a comparator configured to compare the test pattern with a response to the test pattern from the slave device and configured to detect the error.

5. The system on chip of claim 4, wherein the built-in instruction capture circuit comprises:
   an instruction capture unit configured to receive the instruction and store the received instruction in the instruction buffer; and
   a built-in instruction capture controller configured to define the instruction as the error access pattern when the error occurs,
   wherein the built-in instruction capture controller is configured to control the instruction buffer through the bus.

6. The system on chip of claim 5, wherein the instruction capture unit comprises an instruction encoder configured to encode the instruction.

7. The system on chip of claim 6, wherein the built-in self-test circuit comprises an instruction decoder configured to decode the error access pattern to a format used in the test pattern generator.

8. The system on chip of claim 1, wherein the slave device comprises a central processing unit, a graphic processing device, a memory controller, or a peripheral device interface.

9. The system on chip of claim 1, wherein the instruction comprises at least one of a control signal, an address, or data.

10. The system on chip of claim 1, further comprising:
    a central processing unit; and
    a control interface,
    wherein the built-in instruction capture circuit receives information indicating the error occurred from the central processing unit through the control interface.

11. A built-in self-test method of a system on chip, comprising:
    receiving an instruction that is transferred from a master device to a slave device;
    processing the instruction when the instruction is transferred to the slave device;
    storing the instruction in an instruction buffer;
    checking whether an error occurs in the slave device due to processing the instruction; and
    defining the instruction as an error access pattern when the error occurs.

12. The built-in self-test method of claim 11, further comprising generating a test pattern for testing the slave device using the error access pattern.

13. The built-in self-test method of claim 12, wherein when the instruction is received, the instruction is encoded.

14. The built-in self-test method of claim 13, wherein the error access pattern is decoded to a format for generating the test pattern.

15. The built-in self-test method of claim 12, further comprising:
    transferring the test pattern to the slave device; and
    detecting the error by comparing the test pattern with a response to the test pattern from the slave device.

16. The built-in self-test method of claim 11, wherein the slave device comprises a central processing unit, a graphic processing device, a memory controller, or a peripheral device interface.

17. A system on chip, comprising:
    a master device;
    a slave device configured to process an instruction;
    a bus configured to transfer the instruction between the master device and the slave device;
    a capturing circuit configured to receive the instruction; and
    a test circuit having a storage unit,
    wherein the capturing circuit is configured to transmit the instruction to the test circuit for storage in the storage unit and define the instruction as an error access pattern when a first error is caused by the slave device processing the instruction.

18. The system on chip of claim 17, wherein the test circuit is configured to generate a test pattern using the error access pattern and test for a second error in the slave device using the test pattern.

19. The system on chip of claim 18, wherein the test circuit is configured to compare the test pattern with a response to the test pattern from the slave device.

20. The system on chip of claim 17, wherein the instruction is encoded into an encoded instruction, and the encoded instruction is stored in the storage unit.

* * * * *